United States Patent [19]

Biard et al.

[11] Patent Number: 4,529,947

[45] Date of Patent: Jul. 16, 1985

[54] APPARATUS FOR INPUT AMPLIFIER STAGE

[75] Inventors: James R. Biard, Richardson; Ben R. Elmer, Plano, both of Tex.

[73] Assignee: Spectronics, Inc., Dallas, Tex.

[21] Appl. No.: 617,138

[22] Filed: Jun. 4, 1984

Related U.S. Application Data

[60] Continuation of Ser. No. 348,661, Feb. 12, 1982, abandoned, which is a division of Ser. No. 194,124, Oct. 6, 1980, Pat. No. 4,371,847, which is a division of Ser. No. 20,204, Mar. 13, 1979, abandoned.

[51] Int. Cl.³ .............................................. H03F 3/45
[52] U.S. Cl. .................................... 330/259; 330/260; 330/261; 330/308
[58] Field of Search ................. 330/59, 252, 254, 260, 330/261, 259, 307, 308, 257; 307/299 A, 354–356

[56] References Cited

U.S. PATENT DOCUMENTS

| 3,700,921 | 10/1972 | Gay | 307/299 B |
| 3,918,004 | 11/1975 | Shimizu et al. | 307/299 A X |
| 4,177,391 | 9/1978 | Janssen | 330/257 X |
| 4,230,953 | 10/1980 | Wilcox | 307/299 A X |

OTHER PUBLICATIONS

Bhola et al., "Low Drift Design of Differential DC Amplifiers," *Electronic Engineering*, Oct. 1966, pp. 659–661.

Primary Examiner—James B. Mullins
Attorney, Agent, or Firm—Kanz, Scherback & Timmons

[57] ABSTRACT

A differential stage of an amplifier includes an input transistor and a second transistor with a significantly greater emitter cross-sectional area than the input transistor. Quiescent emitter current is divided between the two transistors in substantially the same ratio as the emitter cross-sectional areas so that the emitter current densities are substantially equal.

15 Claims, 10 Drawing Figures

APPARATUS FOR INPUT AMPLIFIER STAGE

This application is a continuation of application Ser. No. 348,661, filed Feb. 12, 1982, now abandoned, which was a division of application Ser. No. 194,124, filed Oct. 6, 1980, which issued as U.S. Pat. No. 4,371,847 which was a division of application Ser. No. 020,204 filed Mar. 13, 1979, now abandoned.

BACKGROUND OF THE INVENTION

1. Field of the Invention

The present invention relates generally to data transmission links and in one of its aspects to a fiber optic data transmission link to be powered by low voltage single polarity power supplies with unreliable voltage levels over a wide range of temperatures.

2. Description of the Prior Art

Control systems such as control systems for airplanes are often of a conventional wire connected electrical nature. Wire connected electrical control systems are subject to electrical noise picked up by the control cables. Other conducted electrical data transmission links are subject to similar problems. One way of obviating the problem of electrical noise picked up by the transmission cables is to transmit data optically rather than electrically. One way of transmitting optical data is by the use of fiber optics cables.

One way of generating optical data is by the use of a light emitting device such as a light emitting diode known as an LED. The LED is a low impedance device when operated under forward bias and exhibits a negative temperature coefficient. Thus, to avoid avoid thermal runaway, the LED can be driven from a high impedance source, ideally a constant current source. Control systems are often used in environments where the power supply is low voltage and produces output with an unreliable voltage level, and temperatures vary over a wide range, so the LED transmitter must regulate the LED current against changes in supply voltage and changes in temperature.

Most amplifier work in the past has been done in "matching systems", systems where the transmitting medium such as a cable or an antenna is largely resistive in nature so that the transmitters and receivers are designed to match the impedance of the cable or antenna. Photodiodes, on the other hand, are highly capacitive in nature.

In order to put an entire transmitter or an entire receiver upon a single chip, it is necessary to make the transmitter or receiver and the logic of compatible integrated circuit technology. Typically the logic circuitry is transistor-transistor logic known as TTL. TTL is almost always used to transmit unipolar signals, but data is often most easily transmitted by a bipolar system, especially for transmitting codes with approximately a 50 percent duty cycle such as a Manchester code since the problems of dc voltage offsets can be avoided.

A common restriction, especially for systems designed for the military, is that the system be able to operate on a positive power supply only. Additionally, most of the bipolar technology industry is geared for producing npn technology only.

There is very little problem with noise picked up in transmission in fiber optics systems, so that the noise generated from the system itself determines the performance of the system.

SUMMARY OF THE INVENTION

The present invention concerns a method and apparatus for transmitting conducted electrical data by converting the conducted electrical data into electromagnetic radiated wave data such as microwave or optical data and transmitting the optical data, for example, to a receiver which reconverts the optical data into conducted electrical data. A fiber optic data transmission link according to the present invention is designed to be used in conjunction with at least one power supply and includes a transmitter powered by the at least one power supply for acquiring conducted electrical data and transmitting optical data corresponding to the conducted electrical data, a receiver powered by the at least one power supply for receiving optical data and generating conducted electrical data corresponding to the optical data, and at least one fiber optic data transmission cable for transmitting the optical data from the transmitter to the receiver. Often a fiber optic data transmission link according to the present invention is used to electrically isolate one piece of equipment from another. In such a case it is preferable that the at least one power supply comprise at least two power supplies with no power supply in common between the transmitter and the receiver.

Power and reference voltages are supplied by a temperature compensated voltage reference circuit and are substantially constant in the temperature range from $-55°$ C. to $+150°$ C. and in the range of power supply voltage from ten percent below the nominal power supply voltage to ten percent above the expected power supply voltage. The relative current in two branches of the voltage reference circuit is determined by the relative cross-sectional area of the emitters of transistors in the two branches.

A transmitter according to the present invention includes an input gate for accepting conducted electrical data from a source outside of the transmitter, a light emitting device for emitting a significant amount of light to the at least one fiber optic data transmission cable when supplied with sufficient electric current, and an output driver for supplying the light emitting device with sufficient electric current for emitting a significant amount of light responsive to the conducted electrical data accepted by the input gate.

A transmitter according to the present invention also includes a temperature compensated voltage reference circuit for supplying a reference voltage. The output driver includes a plurality of resistors of predetermined differing values and a means for applying the reference voltage across a predetermined resistance made up of at least one preselected resistor of the plurality of resistors whereby the current supplied to the light emitting device by the output driver when the output driver is on is substantially a predetermined constant. Both linear circuitry and logic circuitry can be included on the same chip.

One arrangement of a transmitter according to the present invention also includes a pre-bias current source for continuously supplying electric current to the light emitting device. The amount of current supplied by the pre-bias current source is less than the amount of current sufficient for the light emitting device to emit a significant amount of light, but the substantially constant predetermined current supplied by the output driver when the output driver is on added to the current from the pre-bias current source is sufficient for the light emitting device to emit a significant amount of light so that the light emitting device is responsive to the output driver. By keeping the light emitting device turned on at a low level at all times it can respond more quickly to the output driver.

Another arrangement of a transmitter according to the present invention includes an encoder, such as a Manchester encoder, between the input gate and the output driver in order for the receiver to accept a non-return-to-zero code. By use of the encoder the non-return-to-zero code is converted to a return-to-zero code with a substantially fifty percent duty cycle for transmission.

The receiver comprises the combination of a means for detecting the optical data and generating a corresponding electrical signal, a preamplifier for acquiring the electrical signal as an input and generating bipolar electrical data corresponding to the electrical signal input, a postamplifier for amplifying the conducted electrical data generated by the preamplifier, and an output stage which includes a current mode comparator for acquiring the amplified bipolar electrical data from the postamplifier as an input and generating single-ended conducted electrical data corresponding to the bipolar electrical data as an output. The preamplifier utilizes automatic gain control in order to take into account wide variations in the amplitude of the receiver signal while preventing the stretching of signals due to over driving any amplifier stages. A preferred embodiment of the receiver also includes a reference preamplifier that substantially duplicates the preamplifier and ensures that the preamplifier and the automatic gain control circuit are supplied with the proper currents.

The preamplifier includes an input amplifier for amplifying the input conducted electrical data from the photodiode. The automatic gain control circuit supplies a negative feedback from the output of the input amplifier to the input of the input amplifier and operates so that the effective feedback resistance decreases as the output amplitude increases and increases as the output amplitude decreases so that the electrical gain of the preamplifier decreases as the output amplitude increases and increases as the output amplitude decreases. The automatic gain control circuit includes an automatic gain control capacitor, the voltage across the capacitor being responsive to the output of the input amplifier, and a current divider with two branches. The first branch of the current divider is connected to the inverting input of the input amplifier and the second branch of the current divider is connected to a convenient node in the circuit that has a voltage sufficient to keep the second branch in an active condition. The automatic gain control circuit uses the difference between the voltage across the automatic gain control capacitor and a reference voltage to control the ratio of the current split between the two branches. The difference between the two voltages is adjusted so that the quiescent current in the second branch is significantly greater than the quiescent current in the first branch by a predetermined amount.

The postamplifier includes at least one balanced differential amplifier which includes a means for limiting the difference in voltage between the two differential outputs to a predetermined amount which is small compared to the voltage of the power supply thereby preventing the active devices such as transistors from going too far into saturation and cut off which would distort the conducted electrical data. In a preferred embodiment, the differential amplifer is a transistor differential amplifier and the means for limiting the difference in voltage between the two differential outputs comprises a first diode connected in a forward biased direction from the output of one transistor to the output of the other transistor and a second diode connected in the opposite direction. In one embodiment the postamplifier includes two such differential amplifier stages in tandem with one output of the first differential transistor stage resistively coupled to both inputs of the second differential transistor stage, and the other output of the first differential transistor stage capacitively coupled to only one input of the second differential transistor stage. Such an arrangement uses the inherent common mode rejection of the differential stage to ac couple the two differential transistor stages with only one capacitor.

One embodiment of the receiver also includes a status detector to detect the presence of data signal. The output signals of the receiver and the status indicator can then be logically combined so that a final output is obtained only when signal is present and is of an amplitude greater than the corresponding noise in the circuit.

A method of altering the high frequency electrical characteristics of an electrical component in a monolithic or hybrid circuit, for example a resistor, includes surrounding the resistor on three sides by a guarding resistor so that there is almost no capacitance between the first resistor and the substrate. The voltage across the guard resistor is driven by the voltage across the first resistor by means of a follower circuit. In a more generalized case, the voltage across the guard resistor would be driven by two follower circuits, one at each end of the first resistor.

A method for making a low noise amplifier according to the present invention includes connecting one input of a differential amplifier to a reference voltage, using the second input as the primary input to the amplifier, and making the emitter area of the transistor connected to the reference input many times greater than the emitter area of the input transistor. Thus, when the emitter current of the reference transistor is many times greater than the emitter current of the input transistor, the emitter resistance of the reference transistor is a fraction of the emitter resistance of the input transistor, and the gain and noise of the input stage are controlled by the input transistor, but the dc offset and drift are eliminated as in a conventional differential amplifier.

These and other objects, advantages and features of this invention will be apparent from the following description taken with reference to the accompanying drawings, wherein is shown the preferred embodiments of the invention:

DETAILED DESCRIPTION

Figure 1:
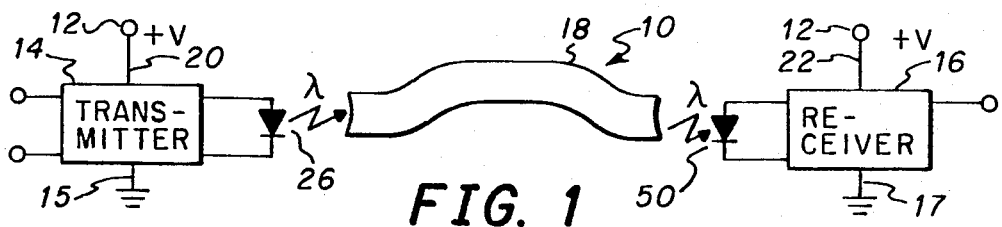
FIG. 1 is a block diagram of a fiber optic data transmission link in accordance with the present invention.

Referring now to FIG. 1, a fiber optic data transmission link in accordance with the present invention is referred to generally by reference numeral 10. Data transmission link 10 is to be used in conjunction with at least one power supply 12 and includes a transmitter 14 powered by at least one power supply 12 for receiving conducted electrical data and transmitting optical data corresponding to the conducted electrical data, a receiver 16 powered by at least one power supply 12 for receiving optical data and transmitting conducted electrical data corresponding to the optical data, and at least one fiber optic data transmission cable 18 for transmitting the optical data from transmitter 14 to receiver 16. Data transmission link 10 also includes means 20 for electrically connecting transmitter 14 to at least one power supply 12, and means 22 for electrically connecting receiver 16 to at least one power supply 12. Frequently a fiber optic data transmission link is used to electrically isolate two pieces of equipment from each other. In such a case it is preferable that at least one power supply 12 comprise at least two power supplies with no power supply in common between transmitter 14 and receiver 16 in order to ensure electrical isolation. Transmitter 14 and receiver 16 are supplied with appropriate ground connections 15 and 17 respectively which may or may not be common between the two pieces of equipment.

Figure 2:
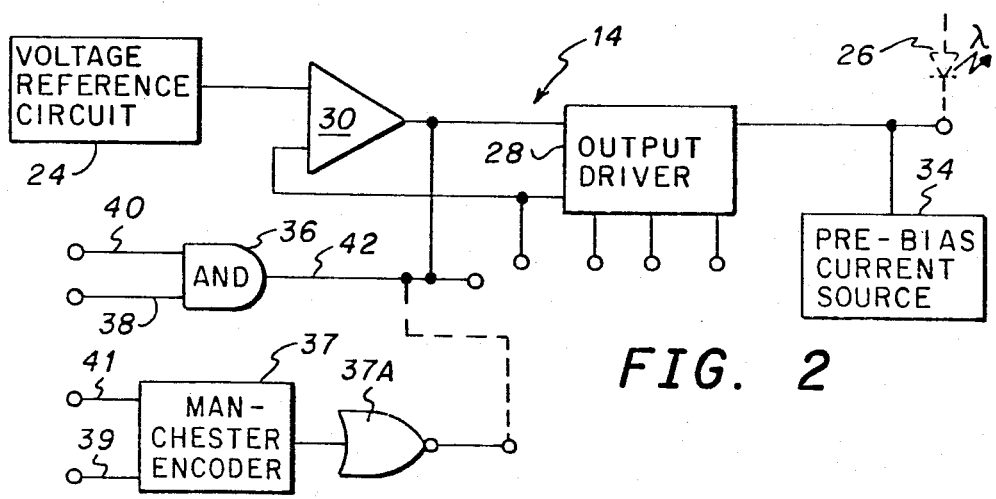
FIG. 2 is a block diagram of an optic transmitter in accordance with the present invention.
Figure 3:
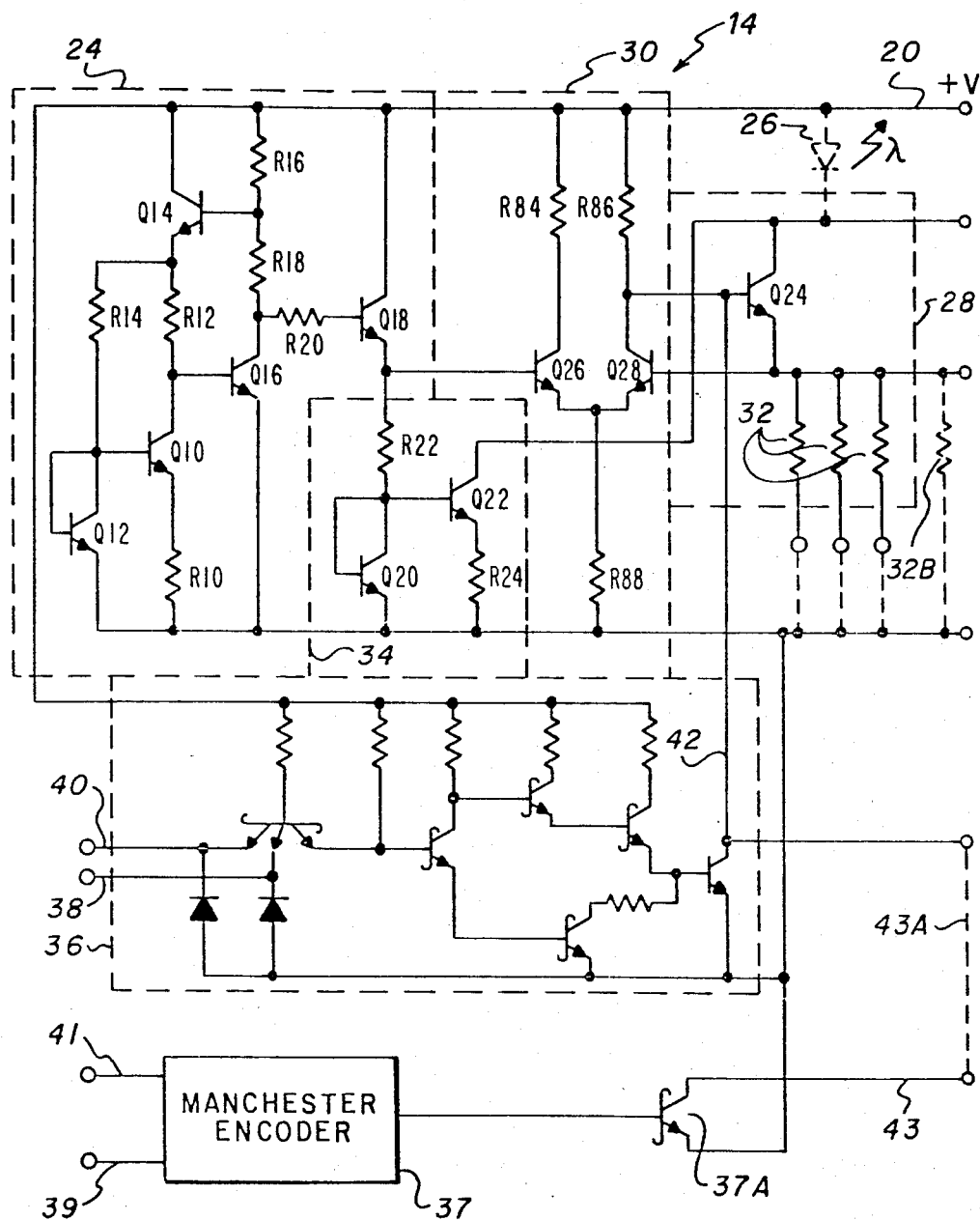
FIG. 3 is a schematic diagram of the optic transmitter of FIG. 2.

Referring now to FIGS. 2 and 3, transmitter 14 comprises in combination a temperature compensated voltage reference circuit 24 for supplying a reference voltage, a light emitting device such as LED 26 for emitting light when supplied with a sufficient amount of electric current, and an output driver 28 responsive to the conducted electrical data accepted as an input by transmitter 14 for supplying electric current to light emitter 26. Transmitter 14 also includes an isolation amplifier 30 electrically connected between temperature compensated voltage reference circuit 24 and output driver 28. Output driver 28 and amplifier 30 together form a direct coupled feedback circuit that applies the output voltage of voltage reference circuit 24 to plurality of resistors 32.

Transmitter 14 further comprises an input gate 36 for driving output driver 28. Input gate 36 is responsive to the electrical data accepted by transmitter 14. Input gate 36 includes an input terminal 38 for accepting the electrical data, an enable terminal 40 for accepting an enable signal, and an output terminal 42. The electrical signal at output terminal 42 corresponds to the electrical data accepted at input terminal 38 only when enable terminal 40 is enabled. Transmitter 14 can also include an encoder such as a Manchester encoder 37 in order to accept a non-return-to-zero (NRZ) code. Manchester encoder 37 is responsive to NRZ electrical data accepted by transmitter 14 at input terminal 39 when terminal 41 is enabled. Inverter 37a is included on the output of Manchester encoder 37 to create an output compatible with the output of input gate 36 so that the two outputs can be combined, in this case by a "wired and" 43a when Manchester encoder 37 is to be used.

Referring to FIG. 3, output driver 28 includes a plurality of resistors 32 of predetermined differing values, and a means including transistor Q24 for applying the reference voltage across a predetermined resistance made up of at least one of plurality of resistors 32. LED 26 is responsive to output driver 28, and the current supplied to LED 26 by output driver 28 when the output driver is on, substantially equals a predetermined portion of the voltage at the output of voltage reference circuit 24 divided by the predetermined resistance so that the current supplied to LED 26 by output driver 28 when the output driver is on, is substantially a predetermined constant. When used in reference to plurality of resistors 32, "differing values" includes the situation where the resistors are of substantially the same value but can be connected in varying configurations which have differing resultant resistance values. As illustrated in FIG. 3, the dashed lines extending from the ends of plurality of resistors 32 represent connections that can be selectively made off the chip, thus putting selected resistor combinations in parallel, having selected resultant resistance values. Off-chip resistor 32b can also be added to plurality of resistors 32.

One embodiment of transmitter 14 also comprises a pre-bias current source 34 for continuously supplying electric current to LED 26 in an amount less than the amount of current sufficient for LED 26 to emit a significant amount of light. The substantially constant predetermined current supplied by output driver 28 when the output driver is on added to the current from pre-bias current source 34 is sufficient for LED 26 to emit a significant amount of light. Thus, LED 26 is responsive to output driver 28. The use of pre-bias current source 34 shortens the turn-on delay time for LED 26. This technique is generally useful despite the fact that LED 26 emits some small amount of light under pre-bias conditions. Although an LED does emit some light at even low current levels, it emits very little light at such low currents.

Temperature compensated voltage reference circuit 24 makes use of a very stable and predictable property of a silicon transistor, the base-emitter voltage ($V_{BE}$), using $V_{BE}$ as a reference to generate a voltage with a given temperature coefficient (TC) which becomes the output of the regulator. The term "temperature compensated" is used here to describe an electrical output and a circuit for obtaining that electrical output which vary in a preselected manner with temperature. Often the preselected manner for the electrical output to vary with temperature is for electrical output to make no substantial variation with temperature over the rated temperature range. In the present case, the electrical output is the reference voltage. Voltage reference circuit 24 includes transistor Q10, diode-connected transistor Q12 connected between the base of Q10 and ground, and substantially equal resistors R12 and R14 connected between the regulated voltage and the collectors of Q10 and Q12 respectively. Voltage reference circuit 24 also includes resistor R10 connected between the emitter of Q10 and ground. Transistors Q10 and Q12 are run at different emitter current densities (J). Voltage reference circuit 24 is of the general type known as a band-gap regulator, but since the high voltage ends of substantially equal resistors R12 and R14 are connected together and the low voltage end are each one base to emitter voltage drop above ground, the current through R12 is the same as through R14 and, hence, the emitter current in Q10 is the same as in Q12, despite the fact that the cross-sectional area of the emitter of Q10 is ten times as great as that of Q12, so the emitter current density of Q12 is ten times that of Q10. This difference in emitter current densities results in a difference in $V_{BE}$ of:

$$\text{Dif.} V_{BE} = \frac{nkT}{q} \ln \frac{(J_{Q10})}{(J_{Q12})} = \frac{nkT}{q} \ln 10$$

where:
T = °Kelvin
k = Boltzman's Constant
q = electronic charge
n = process constant The difference in $V_{BE}$ appears across R10 with a positive TC. Neglecting the transistor Q10 base current, the current in R12 equals the current in R10, so that the voltage across R12 is:

$$V_{R12} = \text{Dif.} V_{BE} \frac{R12}{R10}$$

The regulated voltage is the voltage at the emitter of Q14, which is:

$$V_{EQ14} = \text{Dif.} V_{BE} \frac{(R12)}{(R10)} + V_{BEQ16}$$

The TC of the regulated voltage is the sum of the positive TC across R12 and the negative TC across $V_{BE}$ of Q16. By adjusting the ratio of R12 and R10, the regulated voltage can have zero TC or any other selected value. The regulated voltage $V_{EQ14}$ is thus temperature compensated.

In the past, band-gap regulators have used equal sized transistors Q10 and Q12, and made resistor R12 many times large than resistor R14, to correspond to the present example the resistance of R12 would be ten times the resistance of R14. Thus, the emitter current of Q10 is 1/10 of the current in Q12. Such an arrangement has several disadvantages: (1) the gain around the shunt feedback loop formed by transistors Q14 and Q16 with Q10 and Q12 is low so that the circuit is more responsive to power supply variations, (2) the low bias current in Q10 makes the noise generated in the regulator higher, and (3) the higher values of resistors R12 and R16 use more area on the chip and, therefore, have more capacitance and reduce the frequency response of the regulator. The present invention, on the other hand, keeps the current in the three branches the same by adjusting the emitter area of Q10 to lower the current density. This eliminates the disadvantages listed for the prior art and results in an improved version of the band-gap regulator.

In order to get voltage compensation for variations in supply voltage, temperature compensated voltage reference circuit 24 also includes transistors Q14 and Q18 as well as resistors R16 and R18. The term "voltage compensated" is used here to describe an electrical output and a circuit for obtaining that electrical output which vary in a preselected manner with supply voltage. As with temperature compensation, the preselected manner is often no substantial variation over the rated power supply voltage range. Transistor Q14 was added to partially decouple supply variations from the regulated voltage $V_{EQ14}$. The voltage at the emitter of transistor Q14 is, however, still somewhat responsive to variations in supply voltage since the gain around the feedback loop made up of R12, Q16, R18 and Q14 is not infinite, thus allowing some error voltage at the base of transistor Q14. The value of resistor R16 is selected to make the collector current of transistor Q16 substantially the same as the collector current of Q10 and Q12. The value of resistor R18 is then selected to compensate the voltage at the collector of transistor Q16 against variations in supply voltage by making the ratio of the resistance of R18 to the resistance of R16 such that it gives the smallest variation in the voltage at the collector of transistor Q16, over the rated temperature and voltage range. Reasonable resistor values can be chosen through iterative circuit analysis. An output emitter follower made up of Q18 provides a driving point that is also temperature compensated since the TC at the emitter of Q18 equals the TC at the emitter of Q14. A resistor R20 can be added at the base of Q18 to squelch oscillations resulting from driving a largely capacitive load with Q18 in an emitter follower configuration as is well known in the art. Thus, the voltage at the emitter of Q18 is compensated for both temperature and supply voltage variations. Typical resistance values for resistors R10, R12, R14, R16 and R18 consistent with the present example are 10 ohms, 3433 ohms, 3433 ohms, 6585 ohms, and 253 ohms respectively.

Pre-bias current source 34 comprises a diode-connected transistor Q20 and a resistor R22 connected in series between the reference voltage $V_{EQ18}$ and ground. Pre-bias current source 34 further includes a transistor Q22 for supplying the current sink pre-bias current to LED 26, and a resistor R24 connected to the emitter of transistor Q22. Without resistor R24, transistor Q22 would try to supply an emitter current equal to that in transistor Q20. The inclusion of R24 ensures that the difference in $V_{BE}$ between the two transistors is dropped across R24, thus determining the pre-bias current. Typical resistance values for R22 and R24 consistent with the present example are 1.56K ohms and 100K ohms respectively.

Isolation amplifier 30 separates the large current variations at output terminal 42 and the base of output transistor Q24 from the output of temperature compensated voltage reference circuit 24. Isolation amplifier 30 includes two transistors, Q26 and Q28, and three resistors, R84, R86 and R88, connected in a differential amplifier configuration with the base of Q26 connected to the reference voltage at the emitter of Q18. Typical resistance values consistent with the present example are: R84 = 100 ohms, R86 = 390 ohms, and R88 = 87 ohms. Output terminal 42 of input gate 36 is connected to the base of transistor Q24. The collector of Q28 is connected to the base of output transistor Q24, and the emitter of output transistor Q24 is connected to the base of Q28, forming a tight feedback loop which maintains the emitter of output transistor Q24 at the reference voltage when output terminal 42 is high. Output driver 28 is thus responsive to the electrical data received by transmitter 14 at input terminal 38 when enable terminal 40 is enabled.

When the signal at output terminal 42 is low, it pulls down on the base of Q24, opening the feedback loop thus making the voltage at the emitter of Q24 low so that very little current flows through the collector of Q24 and, hence, through LED 26. The connection of output terminal 42 to the base of transistor Q24 allows LED 26 to be turned on and off with a smaller control current from output terminal 42 than would be possible if output terminal 42 were connected directly in the LED drive current path. A minimum power dissipation in the drive circuit is thus ensured.

Figure 4:
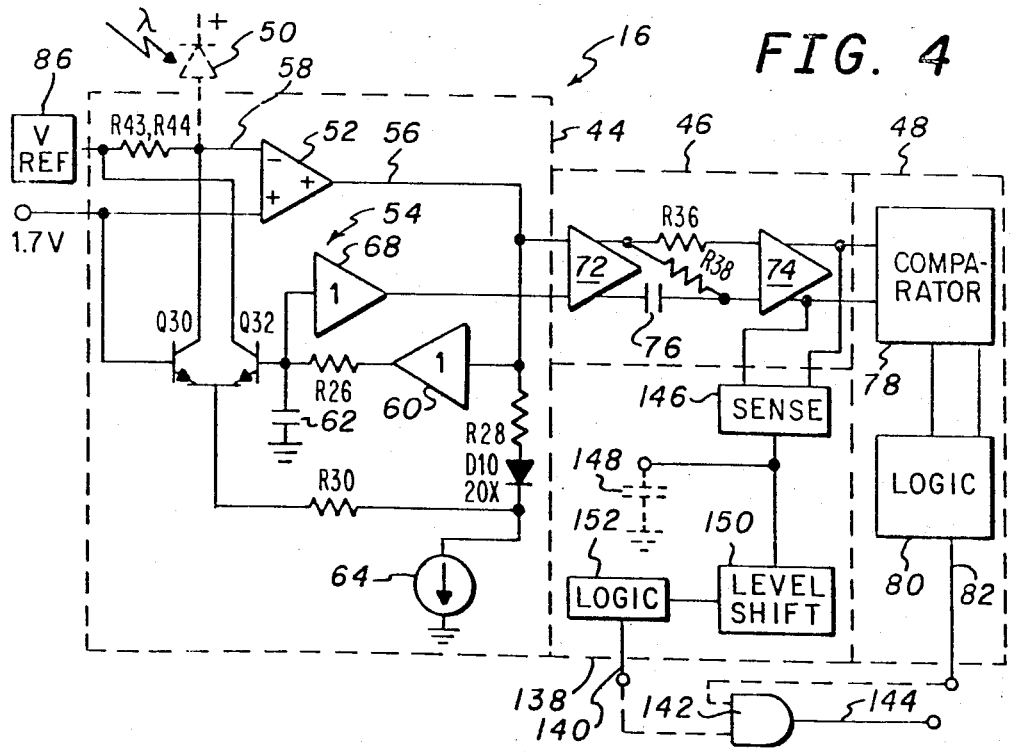
FIG. 4 is a block diagram of an optic receiver in accordance with the present invention.
Figure 5:
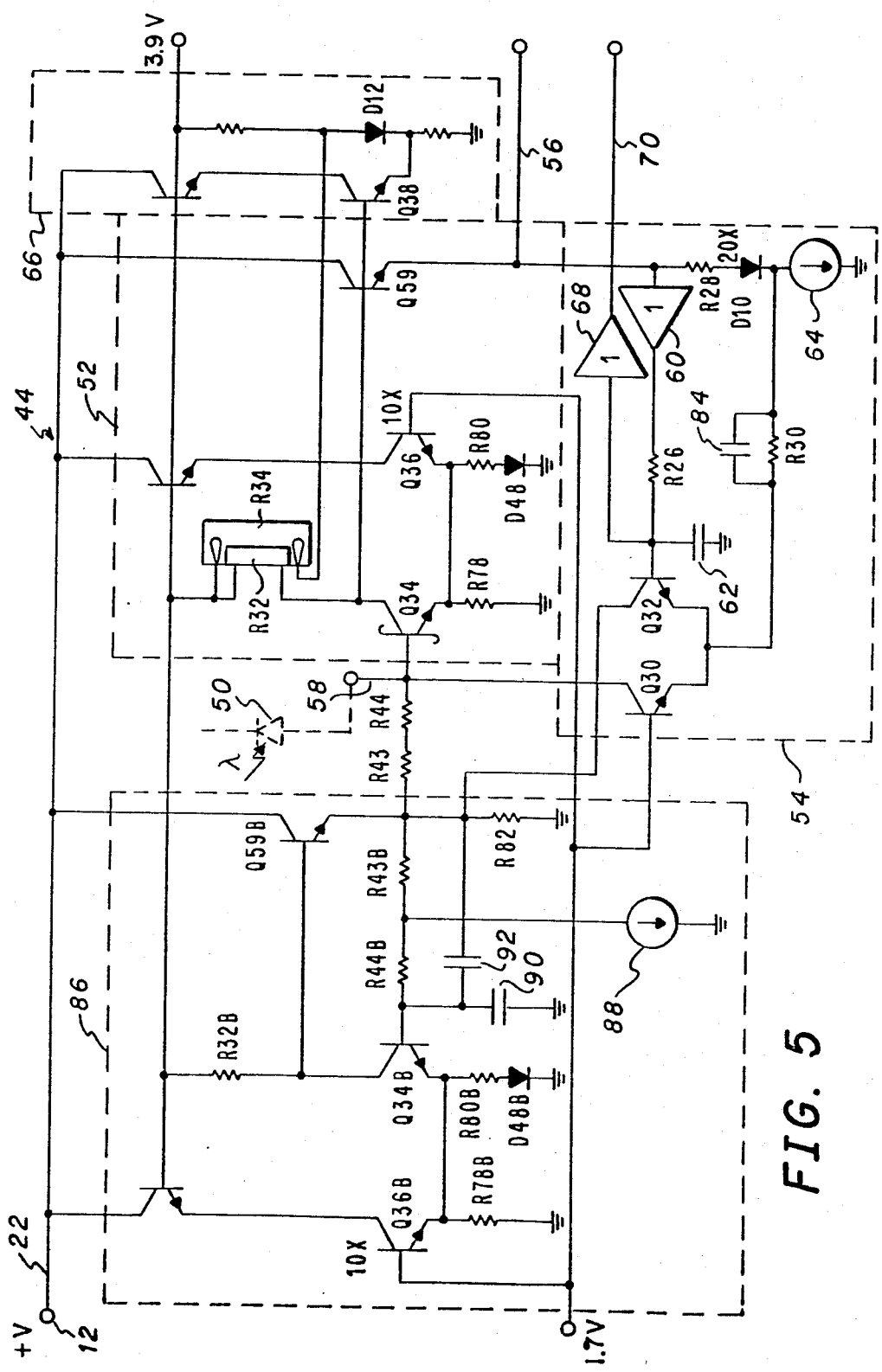
FIG. 5 is a schematic diagram of a receiver preamplifier according to the present invention.
Figure 6:
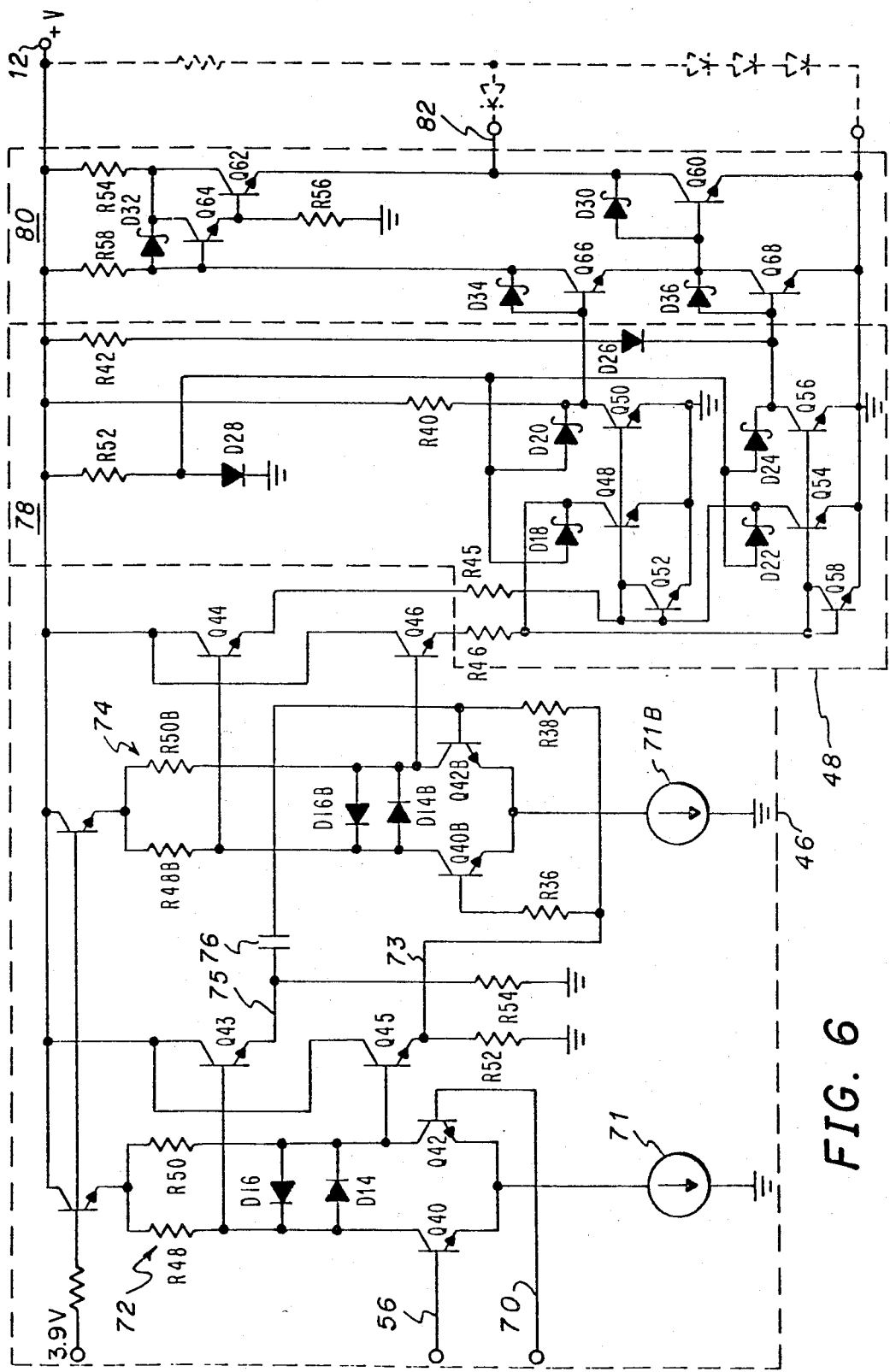
FIG. 6 is a schematic diagram of a receiver postamplifier and output stage according to the present invention.

Referring now to FIGS. 4, 5 and 6, receiver 16 includes a means such as photodiode 50 for receiving the optical data and generating conducted electrical data corresponding to the optical data, a preamplifier 44 for acquiring the conducted electrical data generated by the photodiode 50 and generating automatic gain controlled, amplified conducted electrical data corresponding to the conducted electrical data accepted from photodiode 50, a postamplifier 46 for amplifying and shaping the conducted electrical data generated by preamplifier 44, and an output stage 48 for acquiring the amplified conducted electrical data from postamplifier 46 and transmitting the conducted electrical data. In a preferred embodiment, preamplifier 44 generates bipolar electrical data corresponding to the data accepted by the preamplifier, and output stage 48 transmits single-ended conducted electrical data corresponding to the bipolar electrical data accepted as an input from postamplifier 46. Optical data is, thus, received by photodiode 50, and then converted into conducted electrical data. The conducted electrical data is then amplified by preamplifier 44 which adjusts its gain according to the amplitude of the signal. The conducted electrical signal is then further amplified and shaped by postamplifier 46, and, finally, the signal is converted to a form suitable for output, such as TTL compatible, by output stage 48.

In one embodiment, preamplifier 44 includes an input amplifier 52 for amplifying the input conducted electrical data. The electrical gain of preamplifier 44 is responsive to the amplitude of the input conducted electrical data, the gain decreasing as the amplitude increases and increasing as the amplitude decreases. One way of accomplishing this change in gain is by means of an automatic gain control circuit 54 supplying a negative feedback from output 56 of input amplifier 52 to input 58 of input amplifier 52. The effective feedback resistance decreases as the output amplitude increases and increases as the output amplitude decreases so that the electrical gain of preamplifier 44 decreases as the output amplitude increases and increases as the output amplitude decreases.

Automatic gain control circuit 54 includes a follower circuit 60 for following output 56 of input amplifier 52, and an automatic gain control capacitor 62 which would normally not be included on the chip, the voltage across capacitor 62 being responsive to output 56. Automatic gain control circuit 54 also includes a resistor R26 connected between the output of follower 60 and capacitor 62 so that the voltage response across capacitor 62 will be the typical voltage response across a capacitor in a series RC circuit. Automatic gain control circuit 54 also includes a current divider including a first current branch made up of transistor Q30 and a second current branch made up of transistor Q32. Automatic gain control circuit 54 further includes a constant current source 64, a resistor R28 and a diode D10 connected in series between output 56 of input amplifier 52 and current source 64, as well as a resistor R30 connected from the emitters of Q30 and Q32 to constant current source 64. One suitable constant current source such as for constant current source 64 and others used in this circuit is provided by a current mirror. D10 is preferably a diode-connected transistor with an emitter area much greater than that of Q32, and R28 should have a much lower resistance value than R30. Typical values consistent with the example given would be the emitter of D10 being 20 times as large as that for Q32 and R30 being 1,000 ohms, and R28 being 50 ohms or 1/20 of R30. If constant current source 64 draws one milliamp, then roughly 0.05 milliamp will be drawn through R30 since the voltage drop $V_{BE}$ of Q32 will equal the voltage drop across D10 since Q32 and D10 are fabricated by the same process.

Referring to the loop comprising follower 60, resistor R26, base to emitter of transistor Q32, R30 and its parallel capacitor 84, diode D10 and resistor R28, the dc bias conditions are selected so that a rise in voltage across follower 60 offsets the voltage drop across resistor R26 and there is no net voltage drop from the input of follower 60 to the base of transistor Q32 so that transistor Q32 actually receives its dc base current from the circuitry of follower circuit 68. Therefore, the voltage drop from the base of transistor Q32 to the output of constant current source 64 is the same as the voltage drop across resistor R28 and diode D10. Since resistor R28 is 1/20 the size of resistor R30 and diode D10 is a diode connected transistor with an emitter cross-section area 20 times greater than that of transistor Q32, and since diode D10 and transistor Q32 are made on the same chip by the same process and resistors R28 and R30 are made on the same chip by the same process, the voltage drop across diode D10 tracks the voltage drop across the base to emitter of transistor Q32 with changes in temperature. Thus, the current through resistor R30 remains 1/20 of the current through resistor R28. As will be more fully explained later, the quiescent collector current of transistor Q30 is a predetermined current, in the present example 2.5 microamps. The base of transistor Q30 is connected directly to the 1.7 volt reference voltage and the base of transistor Q32 is connected to automatic gain control capacitor 62. It is the difference between the base voltages of the two current branch transistors that determines the current split between them, the total emitter current of the two transistors equaling 1/20 of the current through resistor R28 and diode D10. Follower circuit 60 is constructed to supply temperature dependent current to transistor Q32 and follower circuit 68 so that the automatic gain control voltage across capacitor 62 is substantially independent of temperature. The automatic gain control circuit, therefore, responds only to the average value of input current from photodiode 50. It can thus be seen that as the voltage across automatic gain control capacitor 62 changes, it will shift the balance between the currents drawn through Q30 and Q32 so that more current is drawn through Q30, making the effective feedback resistance look smaller, thus decreasing the overall gain of preamplifier 44.

The automatic gain control circuit operates on the preamplifier itself to extend the optical signal range of the receiver beyond the normal range obtainable with the power supply voltage limitations discussed. The action of AGC capacitor 62 in the feedback loop is similar to the dc feedback action. As light sensitive device 50 current increases, the voltage across the AGC capacitor decreases by the average value of the voltage at output 56, which is ½ the peak value of the output 56 voltage. Because the voltage at the base of transistor Q32 drops toward ground, transistor Q30 forward bias will increase because its base voltage is constant, and a larger percentage of the current in resistor R30 will not flow in transistor Q30. Thus, the effective feedback resistance seen by the input has decreased. The trans-resistance of preamplifier 44 is reduced. Varying the trans-resistance is equivalent to changing the "gain" of preamplifier 44, and thus the nomenclature "automatic gain control loop". Since the voltage across AGC capacitor 62 is equal to ½ the peak output voltage swing, the trans-resistance will go from 1/20 to one for peak output swing of 0.0 to 0.5 volts. At 0.5 volts R30 appears to be 1,000 ohms.

Input amplifier 52 comprises a differential input stage including an input transistor Q34, which is a Schottky transistor in a preferred embodiment, and a bipolar transistor Q36. The base of transistor Q36 is controlled by the 1.7 volt reference voltage, and the emitter cross-sectional area of Q36 is significantly greater than the emitter cross-sectional area of Q34 so that the quiescent emitter current of transistor Q34 is significantly less than the quiescent emitter current of bipolar transistor Q36 when the transistors are biased to the same base to emitter voltages. In this case, transistor Q36 has ten times the cross-sectional emitter area of transistor Q34 so that transistor Q36 has ten times the quiescent emitter current of transistor Q34. The transistor base to emitter voltages are balanced since the transistors are created by the same process, thus providing drift cancellation. The emitter resistance of Q36 is, however, 1/10 the emitter resistance of Q34:

$$r_e = kT/qI_e$$

where:
$r_e$ = emitter resistance
T = °Kelvin
k = Boltzman's Constant
g = electronic charge
$I_e$ = emitter current Thus, the combined emitter resistance of the differential stage comprised of Q34 and Q36 is only 10 percent greater than that of Q34 alone. The trans-conductance of the differential stage is given by:

$$g_m = 1/(r_e 34 + r_e 36)$$

and the mean square input noise voltage divided by the noise bandwidth is $$(e_n^2 f_{BW}) = 2kT(r_e 34 + r_e 36)$$

Since $r_e 36$ is 1/10 of $r_e 34$, it is clear that the $g_m$ of the stage is decreased by only 10 percent compared to Q34 alone and the mean square input noise voltage is increased by only 10 percent compared to Q34 alone. For a conventional differential stage where the two transistors have the same emitter area, the $g_m$ is reduced by a factor of two and the mean square input noise voltage is increased by a factor of two. The gain and noise of input amplifier 52 is thus controlled by Q34.

A preferred arrangement of preamplifier 44 includes a reference input amplifier 86 designed to supply the correct base current to transistor Q34 of input amplifier 52 and the correct quiescent collector current to transistor Q30 of automatic gain control circuit 54. Again, all values used are by way of illustration and not of limitation. Reference input amplifier 86 includes transistors Q34b and Q36b which are similar to Q34 and Q36 respectively along with bias circuitry similar to that of input amplifier 52. A 1K ohm resistor R33b is connected in series with a 40K ohm resistor 44b to the base of Q34b, and similarly a 1K ohm resistor R43 is connected in series with a 40K ohm resistor R44 to the base of Q34. Reference input amplifier 86 includes a 100 microamp constant current source 88 connected between R43b and R44b so as to create an additional 1/10 volt drop across the 1K ohm resistor R43b. Since transistor Q34b is fabricated the same as transistor Q34 and biased the same, it draws essentially the same base current as Q34. Since the voltage at the common node between R43 and R43b supplies current to both circuits, the extra 1/10 of a volt dropped across R43b is dropped across the combination of R43 and R44, providing the additional one volt divided by 41K ohms or approximately 2.5 microamps. Thus, the current through R43 and R44 supplies the temperature compensated base current for Q34 and an additional 2.5 microamps for the collector of transistor Q30 of automatic gain control circuit 54. Reference input amplifier 86 also includes a transistor Q59b connected in a feedback relationship between the collector of Q34b of reference input amplifier 86 and the common bias node between resistors R43 and R43b, thus regulating the dc bias voltage. The dc conditions of input amplifier 52 and reference input amplifier 86 are duplicated in such a manner that they track one another over temperature. A preferred form of reference input amplifier 86 also includes a capacitor 90 connected between the base of input transistor Q34b and ground and a capacitor 92 connected between the base of input transistor Q34b and the emitter of feedback transistor Q59. Capacitor 90 and capacitor 92 are selected to make the bandwidth of reference input amplifier 86 roughly 1/10 that of input amplifier 52 by moving the high frequency pole of reference input amplifier 36 to roughly 1/10 the frequency of the high frequency pole for input amplifier 52. By cutting off the high frequencies of reference input amplifier 86, the reference input amplifier does not act as a high frequency noise source to the rest of receiver 16. A value of resistor R76 consistent with this example is 2240 ohms. In this example, resistors R43, R43b, R44, R44b, and R76 are all high resistivity (high rho) resistors since high rho resistors have less capacitance than low rho resistors of equivalent resistance and take up less room on the chip.

Figure 7:
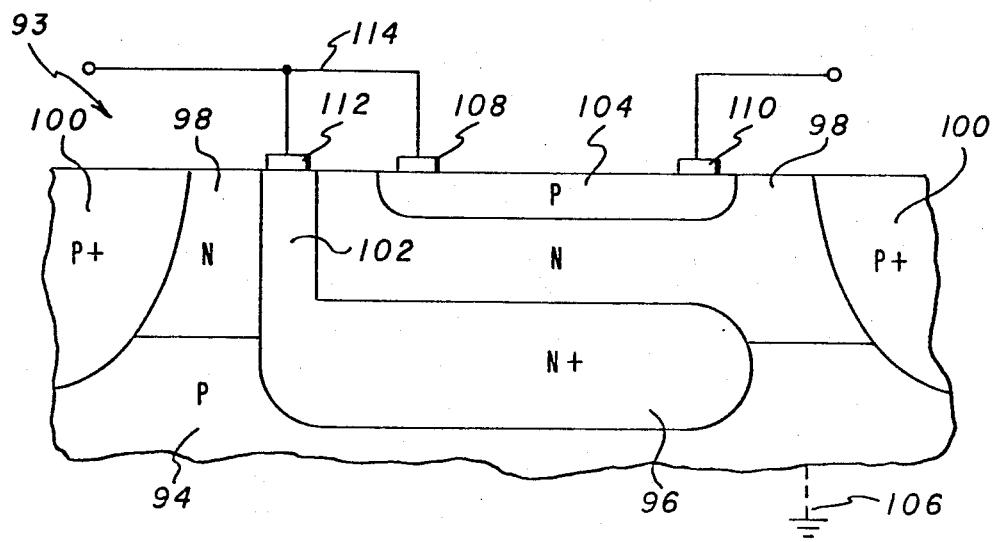
FIG. 7 is a cross-sectional elevation view of an integrated circuit resistor according to the prior art.
Figure 8:
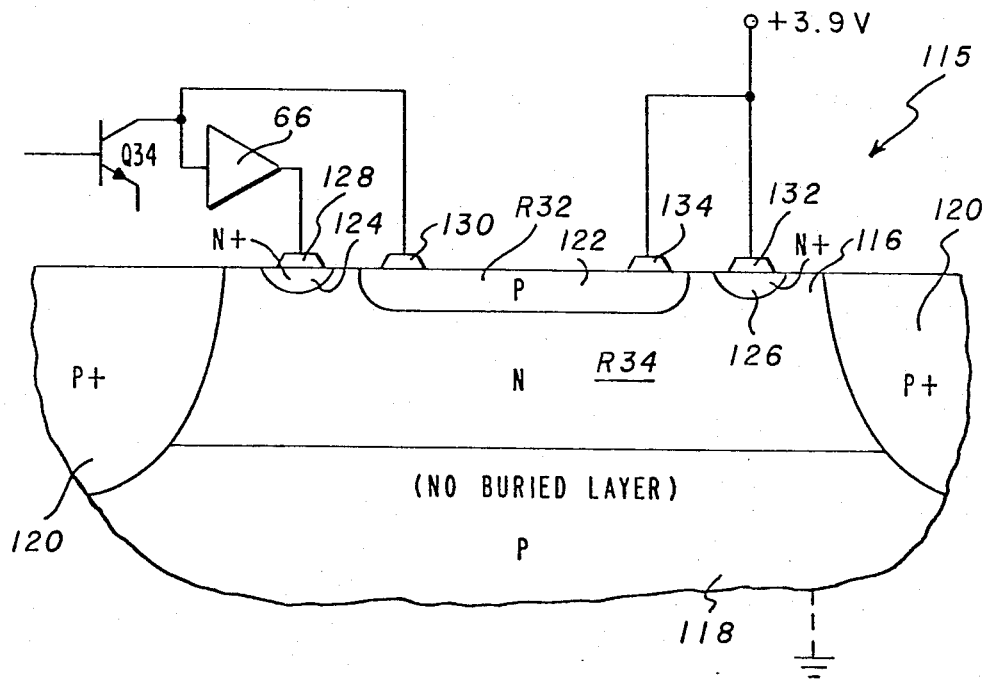
FIG. 8 is a cross-sectional elevation view of an integrated circuit resistor according to the present invention.
Figure 9:
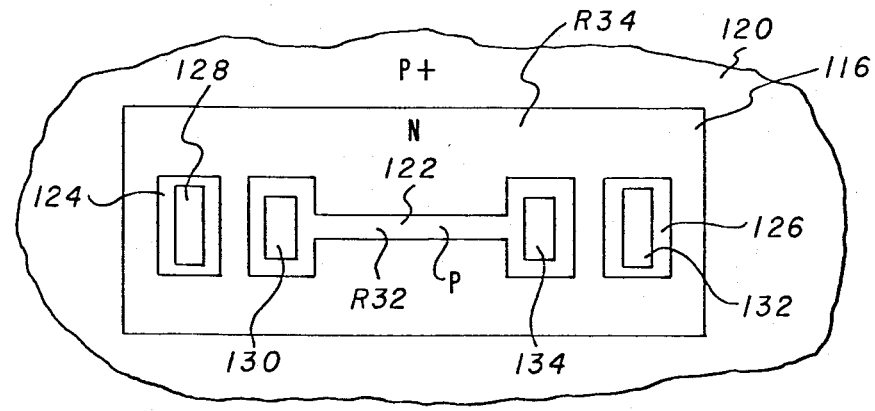
FIG. 9 is a top view of the resistor of FIG. 8.

Transistor Q34 is connected in a common emitter configuration and its base forms input 58 of input amplifier 52. Referring also to FIGS. 7, 8 and 9, input amplifier 52 also includes a load resistor R32 driven by transistor Q34, and a guard resistor R34 of different physical characteristics from resistor R32 substantially surrounding load resistor R32 on three sides wherein the distributed capacitance of load resistor R32 is essentially all to resistor R34 and there is negligible distributed capacitance between load resistor R32 and any other electrical component such as a ground plane. Referring in particular to FIG. 7, an integrated circuit according to the prior art is referred to generally by reference numeral 93. The construction of integrated circuit resistors in the prior art will typically begin with a P-type substrate 94 with an N+ buried layer 96 since monolithic integrated circuit resistors are created by a process similar to the creation of monolithic integrated circuit transistors, and the N+ buried layer is used to provide a low resistance collector contact to the top side of the wafer in transistors. An N-type epitaxial layer 98 is then deposited over the N+ buried layer 96 and the P substrate 94. A P+ isolation diffusion 100 is then added circumferentially to isolate the resistor from other elements, and an N+ sinker deposition 102 is deposited to connect the N+ buried layer 96 to the surface of integrated circuit 93. Finally, a P-area 104 such as a double boron implant is added to the top of N-type epitaxial layer 98 located above the N+ buried layer 96. In this configuration, the N+ buried layer 96 is often referred to as a diffusion under film or DUF. In an integrated circuit such as integrated circuit 93, P-type substrate 94 is grounded by a substrate ground 106. An electrical contact 108 is bonded to the end of P area 104 proximal to the N+ sinker deposition 102, and a second electrical contact 110 is bonded to the end of P area 104 distal to N+ sinker deposition 102. An electrical contact 112 is also bonded to N+ sinker deposition 102 and electrically connected to proximal electrical contact 108 by a wire 114. Thus, in the prior art, a resistor is formed between electrical contact 108 and electrical contact 110 with P and N junctions back biased so as to not create any forward biased diode conditions, but with a distributed electrical capacitance along the length of P area 104 between P area 104 and N+ buried layer 96. With N+ sinker deposition 102 end of the N+ region electrically connected to the proximal end of P area 104, that end of the N+ region is driven by the same voltage as the same end of the resistor, but the opposite end of N+ buried layer 96 is essentially grounded so that the distributed capacitance between P area 104 and N+ buried layer 96 gives a transmission line effect to the integrated circuit resistor.

Referring now to FIGS. 8 and 9, an integrated circuit according to the present invention is referred to generally by reference numeral 115. A resistor according to the present invention is constructed by depositing an N-type epitaxial layer 116 over a P-type substrate 118 with no buried layer in between. As in the prior art, a P+ isolation diffusion area 120 encircles the resistor according to the present invention. Again, a P area 122 is sunk into N-type epitaxial layer 116, but in the present invention an N+ sinker 124 is diffused into N-type epitaxial layer 116 at one end of P area 122 and another N+ sinker deposition 126 is diffused into N-type epitaxial layer 116 at the opposite end of P area 122. An electrical contact 128 is bonded to N+ sinker deposition 124 and an electrical contact 130 is bonded to the respective end of P area 122. Similarly, an electrical contact 132 is bonded to N+ sinker deposition 126 and an electrical contact 134 is bonded to its respective end of P area 122. Back to FIG. 8, electrical contacts 132 and 134 are to be driven by a common voltage or current, in this case the 3.9 volt reference voltage, and electrical contacts 128 and 130 are driven by a common voltage or current, in this case by the collector of transistor Q34, either directly or through follower circuits such as follower circuit 66. In the present example, contact 130 is the electrical contact to the desired P-type resistor R32 that would be degraded by distributed capacitance. Contact 128 is driven with follower circuit 66 to guard R32 and eliminate the effect of the distributed capacitance.

Referring again to FIG. 5, input amplifier 52 also includes at least one follower circuit 66 for driving the voltage across guard resistor R34 by the voltage across load resistor R32. Follower circuit 66 includes common collector transistor Q38 and a level shifting diode D12. The emitter voltage of transistor Q38 follows the collector voltage of input transistor Q34 but approximately one diode voltage drop lower due to the base to emitter voltage drop of Q38. Level shifting diode D12 makes the voltage applied across parallel resistor R34 track that applied across distributed load resistor R32. In general, a method of altering the apparent electrical characteristics of a distributed electrical component that inherently has a distributed shunt capacitance to some other electrical component such as a ground plane, such as a distributed electrical resistance or even an inductance in a hybrid circuit, comprises placing a guard distributed electrical component of a similar type as the distributed electrical component substantially parallel to the distributed electrical component between the component and the ground plane and then driving the voltage across the guard distributed electrical component by the voltage across the distributed electrical component by means of a follower circuit. In the present case, this method makes load resistor R32 appear to the rest of the circuit as a pure resistance without substantial distributed capacitance. Making the input amplifier's load resistor appear to be a pure resistor gives a very fast response time for the input amplifier. A typical value for resistor R32 consistent with the example given is 7234 ohms, and for R32b is 4820 ohms in series with 1840 ohms of high rho resistor.

Making the quiescent emitter current of Q36 ten times as great as the quiescent emitter current for transistor Q34 greatly reduces the noise generated by input amplifier 52 by reducing the noise generated by transistor Q36 since the noise voltage generated by a transistor is:

$$e_n^2 = 2kTf_{BW}\frac{(kT)}{(qI_e)}$$

where:
$e_n^2$ = the square of the noise voltage
T = °Kelvin
k = Boltzman's Constant
q = electronic charge
$f_{BW}$ = noise bandwidth
$I_e$ = emitter current of the transistor The change in the voltage at the base of transistor Q34 with temperature is determined by the dc feedback loop made up of transistor Q59, resistor R28, diode D10, resistor R30 and transistor Q30. Since it is desirable to keep the dc voltage offset between the base of transistor Q34 and the base of transistor Q36 zero or at least very small, the 1.7 volt regulated power supply is designed to have a temperature coefficient similar to that of the feedback loop, but since there is no feedback mechanism to control the offset of transistor Q36, and since the emitter current of transistor Q36 is much greater than that of transistor Q34, a special resistor-diode circuit is connected between the emitters of the two transistors and ground. The resistor-diode circuit consists of resistor R78 in parallel with the series combination of resistor R80 and diode D48. The temperature coefficient of diode D48 is opposite in sign from that of the two resistors, and therefore the change in voltage drop across the diode helps offset the change in voltage drop across the resistors. Typical resistance values consistent with the present example are: R78=R78b=951 ohms, and R80=R80b=211 ohms.

Preamplifier 44 also includes a follower circuit 68 for following the voltage across automatic gain control capacitor 62. Output 70 of follower 68 is thus isolated from the voltage across automatic gain control capacitor 60 and does not drain the charge from the capacitor. The difference in voltage between output 56 and output 70 constitutes a bipolar electrical output, that is electrically bipolar in that its voltage or current representation swings in near equal amplitude about a reference value, so that preamplifier 44 generates bipolar electrical data corresponding to the unipolar optical data received.

It can now be seen that light is received by light sensitive device 50, creating a unipolar signal which is amplified by input amplifier 52. Automatic gain control circuit 54 acts on input amplifier 52 to adjust the gain according to the input signal strength. The signal at the output of input amplifier 52 is averaged by the RC circuit made up of resistor R26 and AGC capacitor 62. The signal at output 56 of input amplifier 52 and the averaged signal of output 56 as it appears across AGC capacitor 62 and at the output of follower circuit 68 create bipolar inputs to post amplifier 46.

Under some circumstances LED 26 emits too much light or light sensitive device 50 has too high an amount of "dark" leakage current. High temperature operation is one example of the latter. Under such circumstances, preamplifier 44 gain is lowered too much for proper operation. One embodiment of preamplifier 44 particularly well suited for operating under circumstances of high dark leakage or too much light breaks the connection between the base of transistor Q32 and AGC capacitor 62. Leads are brought off the chip from both the base of transistor Q32 and AGC capacitor 62. The two leads can be connected together during normal operation. When operating under conditions of constant high current from light sensitive device 50, the lead from the base of transistor Q32 is connected to the same voltage as the base of transistor Q30, in this case the 1.7 volt regulated voltage supply. In this way, the effective feedback resistance is chosen in advance.

Referring to the loop in preamplifier 44 made up of input amplifier 52, resistor R28, diode D10, resistor R30, and transistor Q30, preamplifier 44 is critically damped with two poles to provide loop stability with variations in input. One major pole is at the input node, being that of load resistor R32 and the base-to-emitter capacitance of transistor Q34. The time constant of the base-to-emitter capacitance of transistor Q34 tied to load resistor R32 nominally equals that of the feedback loop so that the pole cancels the zero created by the feedback loop.

The loop is also stable with temperature. Loop stability is independent of the dc open loop gain. It is desirable to have the frequency at which loop gain equals one to not vary with temperature. Since $r_e = kT(qI_e)$, where $r_e$ is the emitter resistance for the input transistor which is constant, dc emitter current $I_e$ is proportional to absolute temperature.

Referring now to FIG. 6, post amplifier 46 amplifies the bipolar electrical data received from preamplifier 44 while also limiting its own output voltage swing in order to prevent saturating its amplifier stages and distorting the electrical signal. Postamplifier 46 includes at least one amplifier 72 for receiving digital data of varying amplitude from preamplifier 44 and transmitting bipolar digital data of relatively constant amplitude corresponding to the data received. Amplifier 72 includes at least one balanced differential transistor stage including a first transistor Q40, a second transistor Q42, load resistors R48 and R50, current source 71 and a means between the output of the first transistor and the output of the second transistor for limiting the difference in voltage between the two outputs to a predetermined amount, the predetermined amount being small compared to the voltage of the at least one power supply, in this case compared to the roughly five volt power supply and the 3.9 volt regulated power supply. The means for limiting the difference in voltage between the two outputs comprises a first diode D14 connected in a forward biased direction from the output of transistor Q40 to the output of transistor Q42, and a second diode D16 connected in a forward biased direction from the output of transistor Q42 to the output of transistor Q40.

In a preferred embodiment, postamplifier 46 comprises two differential amplifier stages 72 and 74, in tandem wherein one output 73 of differential transistor stage 72 is resistively coupled to both inputs of differential transistor stage 74 through equal resistors R36 and R38, and the other output 75 of differential transistor stage 72 is capacitively coupled to only one input of differential transistor stage 74 through capacitor 76. Output 73 is taken from the emitter follower made up of transistor Q45 and resistor R52, and output 75 is taken from the emitter follower made up of transistor Q43 and resistor R54, so the outputs of differential transistor stage 72 correspond to the voltages taken at the collectors of transistors Q42 and Q40 respectively. By dc coupling output 73 through resistors R36 and R38 into both inputs of differential transistor stage 74, the inputs of stage 74 are biased to the same level. The ac coupling of output 75 through capacitor 76 feeds one half of stage 74 and effectively swings the total signal. The conventional way to ac couple two differential stages such as stages 72 and 74 is to capacitively couple output 73 to the base of Q40b and capacitively couple output 75 to the base of Q42b while connecting equal resistances from the base of Q40b to ground and from the base of Q42b to ground. The conventional method of ac coupling thus uses an additional capacitor which normally must be connected externally to the chip. Differential transistor stage 74 can be of construction similar to that described for differential transistor stage 72 with transistor Q40b, transistor Q42b, load resistor R48b, load resistor R50b and current source 71b corresponding to transistor Q40, transistor Q42, load resistor R48, load resistor R50, and current source 71 respectively.

Output stage 48 accepts amplified balanced electrical data from postamplifier 46. It then shapes the data and generates single-ended electrical data which is compatible with TTL logic. In one embodiment, output stage 48 includes a current mode comparator 78 for translating amplified bipolar electrical data from postamplifier 46 to a signal referenced to ground, and logic circuitry 80 for shaping the electrical data, driven by current mode comparator 78 whereby the conducted electrical data at output 82 of logic circuitry 80 corresponds to the conducted electrical data received by transmitter 14.

Differential amplifier 74 includes two common collector output transistors Q44 and Q46 which drive comparator 78 directly by their emitter voltages. Comparator 78 includes two current mode switches, one made up of transistors Q48 and Q50 and diode connected transistor Q52, and the other current mode switch is made up of transistors Q54 and Q56 and diode connected transistor Q58. Diode connected transistor Q52 connects the base of transistors Q48 and Q50 to ground so that transistors Q48 and Q50 match their emitter currents to that of Q52 by forming a current mirror. The other current mode switch is similarly arranged. Comparator 78 also includes a resistor R45 connected between the emitter of transistor Q44 and diode connected transistor Q52 and a resistor R46 connected between the emitter of transistor Q46 and diode connected transistor Q58. The voltage output of output transistor Q46 minus one diode drop is dropped across resistor R46 to provide a current for driving the bases of transistors Q54 and Q56 in one current mode switch and the collector of transistor Q48 in the other. Similarly, the voltage output of output transistor Q44 minus one diode drop is dropped across resistor R45 to provide current for driving the bases of transistors Q48 and Q50 in one current mode switch and the collector of transistor Q54 in the other. Thus, when the output of Q46 is high, it tends to switch Q54 and Q56 low while Q44 does not provide sufficient base current to switch Q48 and Q50 low. The switch is reversed when the output of Q44 is high and the output of Q46 is low. Schottky diodes D18, D20, D22, and D24 are connected from the collectors of Q48, Q50, Q54, and Q56 respectively to the same voltage level as the bases of the transistors, a single diode voltage drop above ground by diode D28 to prevent the current mode switch transistors from switching too hard into saturation and thus shortening or stretching pulses. Current mode comparator 48 also includes equal resistors R40 and R42 connected between the at least one power supply and the collector of Q50 and Q56 respectively for converting the current outputs of current mode comparator 78 into voltage outputs for driving the output logic gate. Diode D26 is included between resistor R42 and the collector of transistor Q56 in order to provide an additional diode drop for interfacing with logic circuitry 80.

A preferred arrangement of logic circuitry 80 for converting the differential output of current mode comparator 78 into a form compatible with TTL logic includes output transistors Q60 and Q62 connected in a "totem pole" arrangement with resistor R54 connected between power supply 12 and the collector of transistor Q62. Output 82 is taken at the junction of the emitter of transistor Q62 and the collector of transistor Q60. Transistor Q62 is the second stage of a darlington pair formed with transistor Q64 and resistor R56. Logic circuitry 80 also includes pull-up transistor Q66 driven by the differential output of current mode comparator 78 at the collector of transistor Q50, and pull-down transistor Q68 driven by the other differential output of current mode comparator 78 at the collector of transistor Q56. The collector of transistor Q68 and the emitter of transistor Q66 are both connected to the base of output transistor Q60. The emitter of transistor Q68 is connected to ground, whereas the collector of transistor Q66 is connected to the base of transistor Q64 and to resistor R58 which is connected to power supply 12. Transistors Q60, Q64, Q66, and Q68 are all clamped with Schottky diodes D30, D32, D34, and D36 respectively. When the current mode comparator 78 output connected to the base of transistor Q66 is high, the current mode comparator output at the base of transistor Q68 is low so that transistor Q66 is conducting and transistor Q68 is not, thus pulling up on the base of transistor Q60 and pulling down on the base of transistor Q64 and hence on the base of transistor Q66 and the emitter of transistor Q66. Pulling up on the base of transistor Q60 and down on the base of transistor Q62 brings the voltage on output 82 low. When the differential outputs of current mode comparator 78 are reversed, on the other hand, making the base of transistor Q68 high and the base of transistor Q66 low, transistor Q66 turns off, its collector going high, and transistor Q68 tries to switch on, but since it cannot get current through transistor Q66, it takes the charge back out of the base of transistor Q60, thus ensuring quick turn-off of transistor Q60. The collector of transistor Q66 going high makes the base of transistor Q64 and the base of transistor Q62 both go high, pulling up the voltage at output 82. Typical resistance values consistent with the present example are: R54=110 ohms, R56=3.5K ohms high rho, and R58=2K high rho. For large values of resistances, it is often advantageous to accept the larger temperature coefficient of the high rho resistor in order to reduce the amount of space taken up on the chip.

Referring again to FIG. 4, one embodiment of receiver 16 also includes a status detector 138 for detecting the presence of a signal in the form of conducted electrical data. In the absence of a signal, receiver 16 will generate an output signal at output 82 which switches on noise within the receiver. Status detector 138 determines if conducted electrical data signal is actually present, and in the example shown, generates a positive signal at status detector output 140 if such a signal is present. Output 140 is then logically anded with receiver output 82 by and gate 142. As shown, and gate 142 is off the chip, but it could also be on the chip. The signal at output 144 of and gate 142 thus corresponds to the optical data received by light sensitive device 50, the signal remaining low when no optical data is received by light emitting device 50. Status detector 138 includes a means 146 for sensing the presence of conducted electrical data at the output of amplifier stage 74, status capacitor 148 external to the chip for smoothing out spikes in the output of means 146 in order to present a dc voltage level, level shifter 150 for shifting the voltage levels to a range compatible with the logic used such as TTL, and logic circuitry 152 for driving output 140.

Figure 10:
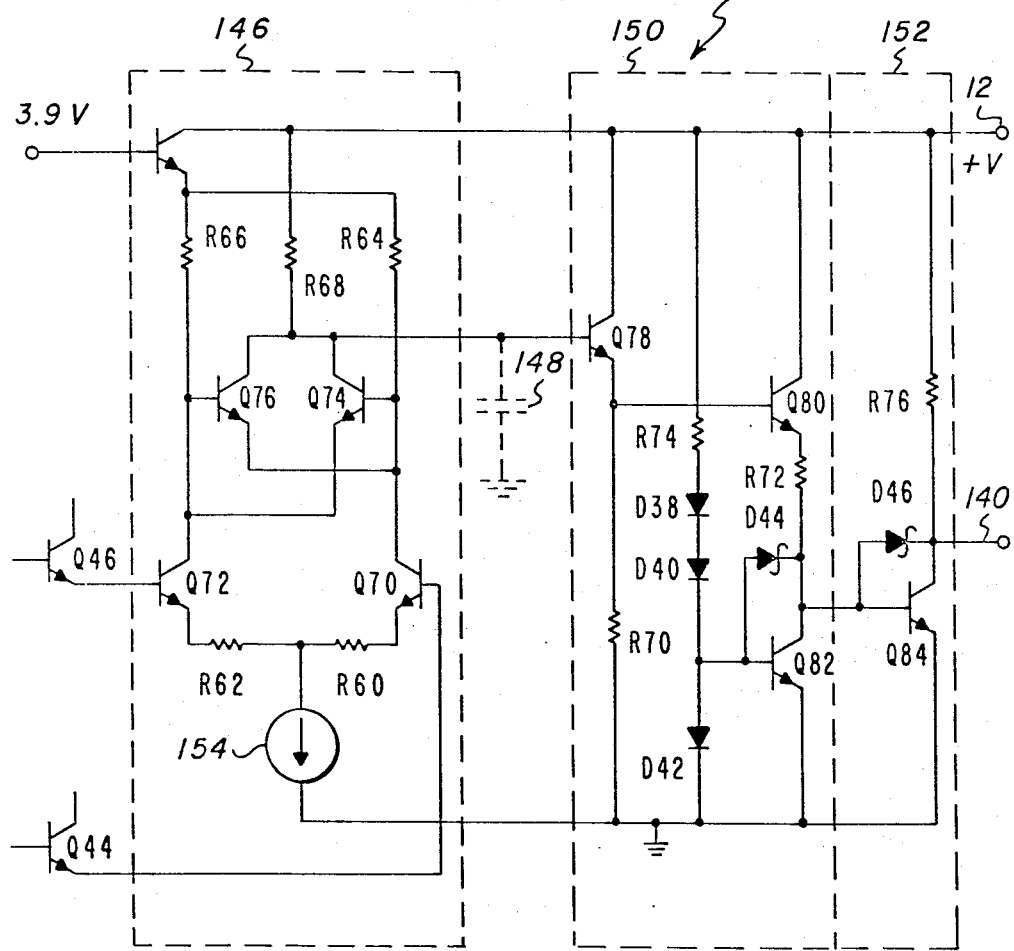
FIG. 10 is a schematic diagram of a status detector according to the present invention.

Referring to FIG. 10, means 146 for sensing the presence of conducted electrical data includes a differential amplifier made up of transistors Q70 and Q72 driven by the emitters of transistors Q44 and Q46 of amplifier 74, emitter resistors R60 and R62 associated with transistors Q70 and Q72 respectively, and load resistors R64 and R66, as well as current source 154 connected between the two emitter resistors R60 and R62. In the present example, current source 154 draws approximately two milliamps. Means 146 also includes clamping transistors Q74 and Q76 cross-coupled in the collectors of transistors Q70 and Q72 of the differential stage, and load resistor R68 connected between power supply 12 and the collectors of Q74 and Q76. In the present example, the amplitude of the differential signal between Q44 and Q46 is 0.4 volts for a peak-to-peak input current of 125 nanoamps. The gain of the differential amplifier portion of means 146 is 1.9 and substantially constant over temperature and power supply variations. This gain produces a signal of 0.76 volts which is equal to the base-to-emitter voltage required to turn on either of clamping transistors Q74 or Q76. Since the collectors of cross-coupled transistors Q74 and Q76 are connected together such that when either is turned on, current through their load resistor R68 drops a voltage across R68, a full-wave rectified signal is produced. The node between the collectors of Q74 and Q76 and load resistor R68 is connected to status capacitor 148. Typical values for the resistors of means 146 consistent with the present example are: R60=R62=174 ohms; R64=R66=760 ohms; and R68=1.5K ohms.

Level shifter 150 includes an input emitter follower made up of transistor Q78 and resistor R70. Level shifter 150 also includes a voltage-to-current translator comprising transistor Q80, current source output transistor Q82 and resistor R72 connected between the emitter of transistor Q80 and the collector of current source output transistor Q82. The collector of transistor Q80 is connected to power supply 12, and the emitter of transistor Q82 is connected to ground. The bias current for the base of transistor Q82 is supplied by the series connection of resistor R74, and diodes D38, D40, and D42 connected between power supply 12 and ground. The base of transistor Q82 is connected between diodes D40 and D42, making the base of transistor Q82 one diode voltage drop above ground. Current source output transistor Q82 is Schottky clamped by Schottky diode D44 to prevent saturation. The output of level shifter 150 taken at the node between resistor R72 and the collector of Q82 becomes the input to logic circuitry 152.

Logic circuitry 152 comprises a single inverter which includes transistor Q84 which is Schottky clamped by diode D46, and load resistor R76 connected between the collector of transistor Q84 and power supply 12. Since the emitter of transistor Q84 is connected to ground and its base is connected to the collector of transistor Q82, the collector-to-emitter voltage of transistor Q82 remains one base-to-emitter voltage drop. The current through resistor R72 thus becomes equal to (the voltage across status capacitor 148 minus the base-to-emitter voltages of Q78, Q80, and Q84) divided by the resistance of R72. The current through diode D42 which is mirrored in the emitter of transistor Q82 equals (the voltage of voltage source 12 minus 3 diode voltage drops) divided by the resistance of R74. The current through resistor R72 minus the current through transistor Q82 is the current through the base of transistor Q84, and the amount of that current determines whether the collector of transistor Q84 will be high or low. For the example given and a voltage source 12 of 4.5 volts, the base of transistor Q78 sees a dc level of about 3 volts when cross-coupled transistors Q74 and Q76 are turned on. If the cross-coupled transistors are turned off due to too low an input current, then the base of transistor Q78 is at the power supply potential of 4.5 volts. The threshold of the TTL output is set such that when status capacitor 148 has discharged one time constant, it will switch to a "one" output. With an R68 of 1.5K ohms, this means 1.5 nanoseconds per picofarad of external capacitance. For a ten megabit per second data rate, the bit time is 100 nanoseconds. Arbitrarily picking three bit times for the response, results in a 200 picofarad external capacitor. For a 10K bit per second data rate and three bit times, this means a 0.2 microfarad capacitor. Typical resistor values consistent with the present example for R70, R74, R72, and R76 are 3K ohms, 2.2K ohm, 1.2K ohm and 4K ohm respectively.

Without the use of status detector 138, receiver 14 is limited to systems that produce a signal of sufficient amplitude continuously. By using status detector 138, receiver 16 can be run asynchronous up to 1/10 of the clock rate without refreshing the most recently received signal. By use of status detector 138 it is possible to have an up to ten megabit circuit that can operate at any lower data rate with a ten megabit sensitivity. The second post amplifier output is used as the input to means 146 for sensing the presence of conducted electrical data because the second post amplifier, post amplifier 74, has the highest level linear signal and makes the sensing relatively straightforward. Because the sensing is a linear function performed at a relatively high voltage level, it must be level shifted to TTL levels in preparation for the open collector TTL output. The TTL output includes an on-chip passive load.

Because of the presence of noise in receiver 16 which is proportional to the square of the frequency of the noise, receiver 16 must have at least two poles in the high-frequency cutoff characteristic so that the total noise will be bounded. The low frequency pole is at $f_o$ and is:

$$f_o = 1/(2R_f C_f) = 13.5 \text{ MHz (in the present example)}$$

where:
$R_f$ = effective feedback resistance (varies by a factor of 20 over the dynamic range in the present example)
$C_f$ = effective feedback capacitance
The second pole is in post amplifier 46 and is:

$$f_2 = 1.85 f_o = 25 \text{ MHc (in the present example)}$$

In summary, conducted electrical data is received by receiver 14 either through input gate 36 if the data is already Manchester encoded or through Manchester encoder 37 if the data is in NRZ form. Manchester encoded conducted electrical data then drives output driver 28 which in turn drives light emitting device 26. LED 26 emits radiated wave data corresponding to the conducted electrical data of output driver 28. The radiated wave data is transmitted through fiber optic data transmission cable 18 and is received by receiver 16 by means of light sensitive device 50. Light is inherently unipolar, but when the data is received by light sensitive device 50, it is converted back into conducted electrical data which is converted into a bipolar form by preamplifier 44. By converting to a bipolar signal referenced about a point somewhere in the mid-range between the power supply voltages, in this case power supply voltages of 3.9 volts and ground, there is less signal degradation of small amplitude signals. The small signal is then further amplified by a post amplifier 46 which brings the signal up to an amplitude which can be compared by comparators 78. The compared signal of comparator 78 is then converted by logic stage 80 to a unipolar signal which is compatible with the logic to be used. In a preferred embodiment, the final output of logic stage 80 is anded with the output of a status detector 138 to ensure that the final signal represents actual data and that receiver 16 is not switching on noise.

The reference voltages used by the receiver are provided by circuitry similar to temperature compensated voltage reference circuit 24 for transmitter 14, but are designed for zero temperature coefficient whereas temperature compensated voltage reference 24 is designed for a temperature coefficient to match that of plurality of resistors 32.

The specific embodiment illustrated of receiver 16 is adapted for use with data that has an approximately fifty percent duty cycle such as a Manchester code, but the principles of the invention can be applied generally. Although a specific embodiment has been described for fiber optic transmission using an LED and a photodiode, both the transmitter and receiver will work for atmospheric transmission or wave guide transmission.

Both circuits also lend themselves well to microwave transmission.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims. As many possible embodiments may be made of the invention without departing from the scope thereof, it is to be understood that all matter herein set forth or shown in the accompanying drawings is to be interpreted as illustrative and not in a limiting sense.

The invention having been described, what is claimed is:

1. An amplifier having an output, comprising in combination:
   a high gain, low noise differential input stage including inverting input transistor means and non-inverting second transistor means, the base of the second transistor means to be controlled by a predetermined voltage wherein the emitter cross-sectional area of the second transistor is significantly greater than the emitter cross-sectional area of the input transistor;
   means for biasing the input transistor means and the second transistor means to substantially equal base to emitter voltages, thereby dividing the quiescent emitter current between the input transistor means and the second transistor means in substantially the same ratio as the emitter cross-sectional areas; and
   means for providing feedback from the output to the base of the input transistor means.

2. An amplifier according to claim 1 wherein the emitter cross-sectional area of the second transistor is approximately ten times greater than the emitter cross-sectional area of the input transistor.

3. An amplifier according to claim 1 further comprising a signal source connected to the base of the input transistor means.

4. An amplifier according to claim 3 wherein the signal source is a photo detector.

5. An amplifier according to claim 1 to be used with means for generating a reference voltage, wherein the means for providing feedback comprises in combination:
   first impedance means connecting the output to the base of the input transistor; and
   second impedance means connecting the reference voltage to the common connection of the first impedance means and the input transistor means.

6. An amplifier according to claim 1 to be used with means for generating a reference voltage, wherein the means for providing feedback comprises in combination:
   a capacitor, wherein the voltage across the capacitor is responsive to the voltage output of the amplifier averaged over a period of time;
   a first current divider branch connected to the base of the input transistor means and having a predetermined quiescent current;
   resistance means connecting the reference voltage to the common connection of the first current branch and the input transistor means for providing current to the first current divider branch; and
   a second current divider branch connected to the first current divider branch at the end opposite the resistance means and the input transistor means, wherein the current in the second current divider branch is controlled by the voltage across the capacitor, the quiescent current in the second branch being significantly greater than the quiescent current in the first branch, whereby the combination of the capacitor, the first current divider branch and the second current divider branch act as an automatic gain control circuit connected in a feedback relationship to the amplifier.

7. An amplifier according to claim 6 further comprising a signal source connected to the base of the input transistor means.

8. An amplifier according to claim 7 wherein the signal source is a photo detector.

9. An amplifier having an output, comprising in combination:
   a high gain, low noise differential input stage including inverting input transistor means and non-inverting second transistor means to be controlled by a predetermined voltage;
   means for biasing the input transistor means and the second transistor means wherein the quiescent current is substantially different in the second transistor means from the quiescent current in the input transistor means; and
   means for providing feedback from the output to the base of the input transistor means.

10. An amplifier according to claim 9 further comprising a signal source connected to the base of the input transistor means.

11. An amplifier according to claim 10 wherein the signal source is a photo detector.

12. An amplifier according to claim 9 to be used with means for generating a reference voltage, wherein the means for providing feedback comprises in combination:
    first impedance means connecting the output to the base of the input transistor; and
    second impedance means connecting the reference voltage to the common connection of the first impedance means and the input transistor means.

13. An amplifier having an output, to be used with means for generating a reference voltage, comprising in combination:
    a high gain, low noise differential input stage including inverting input transistor means and non-inverting second transistor means to be controlled by a predetermined voltage;
    means for biasing the input transistor means and the second transistor means wherein the quiescent current is substantially different in the second transistor means from the quiescent current in the input transistor means;
    a capacitor, wherein the voltage across the capacitor is responsive to the voltage output of the amplifier averaged over a period of time;
    a first current divider branch connected to the base of the input transistor means and having a predetermined quiescent current;
    resistance means connecting the reference voltage to the common connection of the first current branch and the input transistor means for providing current to the first current divider branch; and
    a second current divider branch connected to the first current divider branch at the end opposite the resistance means and the input transistor means, wherein the current in the second current divider branch is controlled by the voltage across the capacitor, the quiescent current in the second branch being significantly greater than the quiescent current in first branch, whereby the combination of the capacitor, the first current divider branch and the second current divider branch act as an automatic gain control circuit connected in a feedback relationship to the amplifier.

14. An amplifier according to claim 13 further comprising a signal source connected to the base of the input transistor means.

15. An amplifier according to claim 14 wherein the signal source is a photo detector.

* * * * *